US008633644B2

(12) United States Patent
Yamamoto et al.

(10) Patent No.: US 8,633,644 B2
(45) Date of Patent: Jan. 21, 2014

(54) THIN-FILM FORMED SUBSTRATE, ORGANIC ELECTROLUMINESCENCE DISPLAY DEVICE, COLOR FILTER SUBSTRATE, AND METHOD OF PRODUCING THIN-FILM FORMED SUBSTRATE

(75) Inventors: Emi Yamamoto, Osaka (JP); Tohru Sonoda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 256 days.

(21) Appl. No.: 13/063,335

(22) PCT Filed: May 12, 2009

(86) PCT No.: PCT/JP2009/058852
§ 371 (c)(1),
(2), (4) Date: Mar. 10, 2011

(87) PCT Pub. No.: WO2010/032514
PCT Pub. Date: Mar. 25, 2010

(65) Prior Publication Data
US 2011/0187267 A1    Aug. 4, 2011

(30) Foreign Application Priority Data

Sep. 19, 2008   (JP) ................................ 2008-240881

(51) Int. Cl.
*H05B 33/04* (2006.01)

(52) U.S. Cl.
USPC ........................... 313/506; 313/504; 313/512

(58) Field of Classification Search
USPC ............... 313/504, 506, 503, 512; 445/24, 25
See application file for complete search history.

(56) References Cited

U.S. PATENT DOCUMENTS

| | | | |
|---|---|---|---|
| 2002/0060518 A1 | 5/2002 | Duineveld et al. | |
| 2004/0021413 A1* | 2/2004 | Ito et al. | 313/504 |
| 2005/0116632 A1 | 6/2005 | Funamoto | |
| 2006/0119258 A1* | 6/2006 | Sakata et al. | 313/504 |
| 2006/0220544 A1 | 10/2006 | Okuyama | |

FOREIGN PATENT DOCUMENTS

| | | |
|---|---|---|
| JP | 2005-326799 | 11/2005 |
| JP | 2006-310289 | 11/2006 |
| JP | 2007-095630 | 4/2007 |
| JP | 2007-095729 | 4/2007 |
| JP | 2007-280866 | 10/2007 |
| JP | 2008-004376 | 1/2008 |
| JP | 2008-210540 | 9/2008 |
| JP | 2010-192215 | 9/2010 |

OTHER PUBLICATIONS

International Search Report for PCT/JP2009/058852, mailed Aug. 18, 2009.

* cited by examiner

*Primary Examiner* — Mary Ellen Bowman
(74) *Attorney, Agent, or Firm* — Nixon & Vanderhye P.C.

(57) ABSTRACT

The present invention provides a thin-film formed substrate, an organic electroluminescent display device, a color filter substrate, and a method of producing a thin-film formed substrate. The thin-film formed substrate according to the present invention is a thin-film formed substrate provided with a substrate and a thin film formed on the substrate, the substrate comprising a first bank forming a depression on the substrate, and a second bank formed on the first bank, wherein a partitioned region surrounded by the second bank has a plurality of the depressions arranged therein, and the thin film is arranged in each of the depressions.

25 Claims, 5 Drawing Sheets

THIN-FILM FORMED SUBSTRATE, ORGANIC ELECTROLUMINESCENCE DISPLAY DEVICE, COLOR FILTER SUBSTRATE, AND METHOD OF PRODUCING THIN-FILM FORMED SUBSTRATE

This application is the U.S. national phase of International Application No. PCT/JP2009/058852, filed 12 May 2009, which designated the U.S. and claims priority to Japanese Patent Application No. 2008-240881, filed 19 Sep. 2008, the entire contents of each of which are hereby incorporated by reference.

TECHNICAL FIELD

The present invention relates to a thin-film formed substrate, an organic electroluminescent (hereinafter also referred to as organic EL) display device, a color filter substrate, and a method of producing a thin-film formed substrate. More specifically, the present invention relates to a thin-film formed substrate, an organic EL display device, a color filter substrate, and a method of producing a thin-film formed substrate which enable suitable use of a coater such as an ink jet device in production.

BACKGROUND ART

Film production technologies are frequently used in production of displays such as formation of semiconductive layers. Particularly the film production technology using an ink jet device (ink jet method) is employed in production of organic EL layers for organic EL elements, color filter layers for color filter substrates, and functional thin films such as pattern wirings for metal wiring substrates. The ink jet method makes it possible to easily adjust the thickness of thin films and easily respond to enlargement of the area compared to solid phase methods such as deposition. Further, the ink jet method provides high material efficiency, and thus makes it possible to reduce the cost.

Generally in the ink jet method, a functional fluid containing a functional material (thin film material) and a solvent is applied and then the solvent is removed to leave a functional thin film. If the solvent volatilizes at the head portion and thereby a functional material or the like is precipitated during ejection of the printing liquid droplets, ejection defects may occur such as that the droplets maybe ejected onto different positions or the amounts of ejected droplets may be different. Further, depending on the differences in the ejection accuracy or the ejection amount of the nozzles of the ink jet device, functional thin films having desired film thicknesses may not be achieved or the film thicknesses of the functional thin films may be different.

The ink jet method thus usually employs a process of applying a functional fluid to regions partitioned by portions called banks. For example, Patent Document 1, discloses a technology of filling a functional fluid in the regions partitioned by banks and forming patterned wirings. This technology requires the banks to be formed corresponding to the wiring patterns, and thus still has room for improvement in that it is difficult to form, with this technology, complicated wiring patterns or high resolution devices. Meanwhile, Patent Documents 2, and 3, each disclose a technology of stacking lyophilic bank and a lyophobic bank. As for this technology, there is room for improvement in that when a surface treatment is performed on the bank stacked on the upper side, the effect of the bank arranged thereunder is negated, and thus sufficient effects cannot be provided. Patent Document 4, discloses an organic EL display device in which an organic EL layer is formed in a region partitioned by stacked lyophilic first bank and a lyophobic second bank. In this technology, there is room for improvement in that an electron injection transport layer cannot be completely covered by a middle layer and a light-emitting layer, which are to be applied on the electron injection transport layer, because the electron injection transport layer is attached on the wall surface of the banks or on the banks, and the incomplete covering causes a direct contact between the electron injection transport layer and the cathode, whereby the functions of the organic EL layer decrease.

[Patent Document 1]
Japanese Kokai Publication No. 2007-95729
[Patent Document 2]
Japanese Kokai Publication No. 2007-280866
[Patent Document 3]
Japanese Kokai Publication No. 2008-4376
[Patent Document 4]
Japanese Kokai Publication No. 2005-326799

DISCLOSURE OF INVENTION

Hereinafter, the problems in conventional substrates having a thin film will be described with an example of an organic EL element.

An organic EL element has a structure in which an organic EL layer including at least a light-emitting layer is sandwiched by an anode and a cathode, and is arranged in a pixel region surrounded by a bank. Further, an organic EL element usually has organic layers such as an electron injection layer, a carrier transport layer (an electron transport layer, a hole transport layer), and a hole injection layer as well as a light-emitting layer. A carrier transport layer is usually designed to have lower resistance and a higher conductivity than a light-emitting layer in order to allow a sufficient electric field to be applied to the light-emitting layer. Further, in order to prevent carriers from passing through the light-emitting layer without contributing to light emission, a carrier blocking layer, which is a functional material layer for capturing the carriers within the light-emitting layer, may be formed between the carrier transport layer and the light-emitting layer. Such a carrier blocking layer usually has low conductivity, and therefore has a much smaller thickness than the light-emitting layer in many cases. Since an organic EL element is formed by laminating thin films (organic EL layers) in the above way, it has been particularly difficult for such an organic EL element to have uniformly controlled film thicknesses as compared to color filter substrates and wiring substrates.

Now, a case will be described in which a hole transport layer and a light-emitting layer are sequentially laminated by applying functional fluids to each pixel region surrounded by a bank by the ink jet method. Here, anodes are already formed in the pixel regions. First, a functional fluid containing a hole injection material and a solvent is ejected on each anode and then the solvent is removed by drying and heating so that a hole transport layer is formed on the anode. Subsequently, a functional fluid containing a light-emitting material and a solvent is ejected onto the hole transport layer. At this time, the functional fluid may not be sufficiently maintained within the region surrounded by the bank depending on the shape of the bank and, as a result, the functional fluid may not completely cover the hole transport layer and the anode. In this case, a part of the anode and the hole transport layer turns out to be exposed. If a cathode is formed on the light-emitting layer in this state by a method such as a vacuum deposition, the cathode comes in contact with the hole transport layer and the anode directly without the light-emitting layer interposed therebetween, at the portions where the hole transport layer and the anode are exposed. At those contact portions, carriers cannot contribute to light emission in the case that light is emitted by application of electric current to the organic EL element, and thereby the electric current utilization efficiency decreases. The decrease causes problems such as a decrease in brightness, generation of heat, and an increase in power consumption, which lead to major problems in the power efficiency or the element life. The hole transport layer and the anode are therefore preferably completely covered by the light-emitting layer. The above problems similarly arise in a structure in which an electron transport layer is arranged between the cathode and the light-emitting layer, when there is contact, without the light-emitting layer interposed, between the anode and the cathode, between the hole transport layer and the electron transport layer, between the hole transport layer and the cathode, or between the electron transport layer and the anode.

In a structure in which each of the pixels is enclosed (partitioned) by the bank parts, a functional fluid is to be ejected in the respective pixels and maintained in the respective pixels. Here, since nozzles may eject droplets in different amounts because of the different nozzle sizes generated in the production, and thereby the amount of a functional fluid to be applied can be different from pixel to pixel. Also, when the position onto which a functional fluid droplet is ejected happens to be displaced and the functional fluid accordingly enters an adjacent pixel, the amounts of the functional fluid can be different in the respective pixels. As a result, the organic EL layers can have different thicknesses for the respective pixels, and the difference appears as display unevenness.

Those problems cannot be solved even by the technologies of Patent Documents 2, to 4.

The present invention has been made in view of the above state of the art, and aims to provide a thin-film formed substrate which can easily achieve improvement in thin-film flatness and a yield rate; an organic electroluminescent display device; a color filter substrate; and a method of producing a thin-film formed substrate.

Means for Solving the Problems

The present inventions have made various studied on thin-film formed substrates which can easily achieve improvement in thin-film evenness and a yield rate without an additional complicated production process. As a result, the inventors have focused on use of two kinds of banks. More specifically, a first bank forming depressions is arranged on the substrate and then a second bank is arranged on the first bank in such a manner as to surround the depressions. This arrangement has been found to enable application of a functional fluid in a region (partitioned region) surrounded by the second bank to form a flat thin film within each depression. Further, the arrangement can increase the margins of the alignment accuracy and the droplet placement accuracy of the thin film formation device and thus improve the yield of thin-film formed substrates. In this way, the above problems have been solved admirably and thereby the present invention has been completed.

That is, one aspect of the present invention is a thin-film formed substrate provided with a substrate and a thin film formed on the substrate, the thin-film formed substrate comprising a first bank forming a depression on the substrate, and a second bank formed on the first bank, wherein a partitioned region surrounded by the second bank has a plurality of the depressions arranged therein, and the thin film is arranged in each of the depressions. On the thin-film formed substrate according to the present invention, one first bank may form any number of depressions; that is, a first bank may form multiple depressions or a single depression. In the case that one first bank forms a single depression, multiple first banks may be provided.

When a functional fluid is applied to a region (partitioned region) surrounded by the second bank on the thin-film formed substrate according to the present invention, the functional fluid spreads along side faces of the second bank in such a manner as to cover the depressions. As a result, the fluid level of the functional fluid in the respective depressions can be suitably equilibrated. Also, since the first bank maintains (pins) the functional fluid within the depressions, the functional fluid is enclosed within the depressions in a process of removing the solvent. In the above manner, a flat thin film can be formed at a desired position (depression).

The thin-film formed substrate according to the present invention can also increase the margins of the alignment accuracy and the droplet placement accuracy of a thin-film formation device in the case of including the first bank and the second bank in a stacked manner as compared to the case of including the first bank only. Thereby, defects in a thin-film formation process (for example, thickness variation of thin films) can be suppressed, and the yield of thin-film formed substrates can be improved.

A thin film herein refers to a film which has a thickness suitable for a component such as an organic EL layer of an organic EL element and a color filter of a color filter substrate. More specifically, the thin film may have a thickness of 0.01, to 3 μm. First and second banks herein each refer to a partition wall placed in a frame-like arrangement (a frame-like object).

The structure of the thin-film formed substrate according to the present invention is not particularly limited as long as the thin-film formed substrate includes the above components, and may or may not include other components.

Preferable embodiments of the thin-film formed substrate according to the present invention are described in detail below. Note that the various embodiments below may be appropriately combined.

The partitioned region preferably has a linear planar shape. Such a shape allows a functional fluid applied to a partitioned region to spread along the side faces of the second bank more easily due to the capillary effect. As a result, the fluid level of the functional fluid in the respective depressions can be suitably equilibrated.

In the case that the entire second bank is lyophobic to a functional fluid, it may be difficult for the functional fluid to spread along the side faces of the second bank. In contrast, in the case that the entire second bank is lyophilic to a functional fluid, the functional fluid may flow over the top face of the second bank to flow into a region where no functional fluid is required. Accordingly, the second bank is preferably lyophobic to a functional fluid on a top face, and the second bank is preferably lyophilic to a functional fluid on a side face. Such a structure can be achieved for example by performing a lyophobicity providing process on the second bank formed from a lyophilic material. However, in the case that a lyophobicity providing process is performed on the second bank having a forward-tapered shape, the side faces of the second bank may also be lyophobic. As a result, it may be difficult for a functional fluid to spread along the side faces of the second bank. Hence, the second bank preferably has a reverse-tapered shape. The reverse-tapered shape allows the side faces of the second bank to go into the shadow of the top face of the second bank, and thus reduces the influence of the lyophobicity providing process on the side faces of the second bank. As a result, the second bank can easily have lyophobic top face and lyophilic side faces.

The "top" herein refers to a position farther from the substrate, and the "bottom" herein refers to a position closer to the substrate. Further, the "reverse-tapered shape" herein refers to a shape with an angle of a side face to the substrate face (i.e., taper angle) of 90° or larger, and the "forward-tapered shape" herein refers to a shape with an angle of a side face to the substrate face of smaller than 90°.

One of the conditions for decreasing the influence of the lyophobicity providing process on the side faces of the second bank is that the side faces of the second bank do not project from the top face of the second bank in a plan view. That is, it is preferable that the partitioned region have a linear planar shape, and a length L1 of a bottom face of the partitioned region, in a cross-sectional view of the substrate in a short-side direction of the partitioned region, and a length L2 of a top face of the partitioned region satisfy the relation L1≥L2, and more preferably the relation L1>L2.

If the first bank has a reverse-tapered shape, it may be possible that a functional fluid collects between the substrate and the side faces of the first bank and cannot fully spread within the partitioned region. In such a state, it may be difficult to produce a flat thin film within a depression. Accordingly, the first bank preferably has a forward-tapered shape.

The first bank preferably has a forward-tapered shape, and the second bank preferably has a reverse-tapered shape. Thereby, a functional fluid can be suppressed from collecting between the substrate and the side faces of the first bank, and the influence of the lyophobicity providing process on the side faces of the second bank can be decreased.

The first bank is preferably provided with fluorine on an upper face where the second bank is not arranged. When being provided with fluorine, the first bank can be lyophobic to a functional fluid on the upper face where the second bank is not arranged. As a result, the functional fluid can be more surely maintained (pinned) in a depression, and a flat thin film can be more surely produced. Here, the upper face of the first bank encompasses not only the top face of the first bank but also the side faces of the first bank.

The second bank is preferably provided with fluorine on a top face. When being provided with fluorine, the second bank can be lyophobic to a functional fluid on the top face. As a result, the functional fluid can be more surely enclosed within a partitioned region, and can be more surely prevented from flowing over the top face of the second bank into a region where no functional fluid is required.

The first bank is preferably provided with fluorine on an upper face where the second bank is not arranged, and the second bank is preferably provided with fluorine on a top face. When being provided with fluorine, the first bank can be lyophobic to a functional fluid on the upper face where the second bank is not arranged, and the second bank can be lyophobic to a functional fluid on the upper face. As a result, a flat thin film can be more surely produced within a depression, and the functional fluid can be more surely prevented from flowing over the top face of the second bank into a region where no functional fluid is required. Such a structure, in which the first bank is provided with fluorine on the upper face where the second bank is not arranged and the second bank is provided with fluorine on the top face, can be produced for example by performing, at one time, a fluorine plasma process on the upper face of the first bank where the second bank is not arranged and on the top face of the second bank. Accordingly, the production process can be simplified.

The method of achieving the structure, in which the upper face of the first bank where the second bank is not arranged and/or the top face of the second bank is/are provided with fluorine, may be, alternatively to the above fluorine plasma process, a method of coating the face(s) with a film that contains fluorine.

A distance h1 from the surface of the substrate to a top face of the second bank preferably satisfies the relation h1>65, μm. Such a structure prevents generation of a void portion where no thin film exists on the substrate inside partitioned regions.

If an end of the bottom face of a depression is not 15 μm or farther away from an end of the bottom face of a partitioned region in a plan view, a part of the functional fluid maintained within a depression may be attached to a side face of the second bank, and thereby the uniformity of the thicknesses of the thin films formed within the depressions may be decreased. Accordingly, an end of a bottom face of each depression is preferably 15, μm or farther away from an end of a bottom face of the partitioned region.

It is preferable that the partitioned region have a linear planar shape, the thin-film formed substrate have a first object formed on the first bank, and the first object be in contact with the second bank, and have a planar shape projecting from the second bank toward between the depressions arranged in the partitioned region. This structure enables to prevent excess flow of a functional fluid due to the capillary effect. Further, since the second bank has a similar (analogous) structure to the first bank, the drying speeds of the functional fluid can be made uniform within a partitioned region. With the above structure, it is possible to produce flatter thin films in the depressions.

The first object may be produced from a different material from the second bank, but still is preferably produced from the same material as the second bank. In this case, the first object and the second bank can be formed in the same process, and thus the production process can be simplified. Alternatively, the first object and the second bank may be integrally formed. That is, the second bank may have a projection which functions as the first object.

It is preferable that the partitioned region have a linear planar shape, the thin-film formed substrate have a second object formed on the first bank, and the second object be arranged between the depressions arranged in the partitioned region, and be not in contact with the second bank. The same effect as in the case with the first object can also be achieved in this case.

The second object may be produced from a different material from the second bank, but still is preferably produced from the same material as the second bank. In this case, the second object and the second bank can be formed in the same process, and thus the production process can be simplified.

Another aspect of the present invention is a method of producing the thin-film formed substrate of the present invention, the method comprising: a first bank formation process of forming the first bank on the substrate; a second bank formation process of forming the second bank on the first bank; and an application process of applying a functional fluid containing a thin film material to the partitioned region.

In accordance with the method of producing the thin-film formed substrate of the present invention, when a functional fluid is applied to a partitioned region, the functional fluid spreads along the side faces of the second bank in such a manner as to cover the depressions. As a result, fluid level of the functional fluid in the respective depressions can be suitably equilibrated. Further, since the first bank maintains (pins) the functional fluid within each depression, the functional fluid is enclosed within the depression in a process of removing the solvent. In the above manner, a flat thin film can be formed at a desired position (depression).

The method of producing the thin-film formed substrate of the present invention can also increase the margins of the alignment accuracy and the droplet placement accuracy of a coater in the case of including the first bank and the second bank in a stacked manner as compared to the case of including the first bank only. Thereby, defects in a thin-film formation process (for example, thickness variation of thin films) can be suppressed, and the yield of thin-film formed substrates can be improved.

The method of producing the thin-film formed substrate of the present invention is not particularly limited by other processes as long as including the above process.

A preferable method of producing the thin-film formed substrate of the present invention is explained in detail below. Note that the various embodiments below may be appropriately combined.

The first bank is preferably lyophobic to a functional fluid on an upper face where the second bank is not arranged. This makes it possible to more surely maintain (pin) a functional fluid within a depression, and thus to more surely produce a flat thin film within the depression.

The second bank is preferably lyophobic to a functional fluid on a top face. As a result, a functional fluid can be more surely maintained within a partitioned region, and can be more surely prevented from flowing over the top face of the second bank into a region where no functional fluid is required.

The first bank is preferably lyophobic to a functional fluid on an upper face where the second bank is not arranged, and the second bank is preferably lyophobic to a functional fluid on a top face. As a result, a flat thin film can be more surely produced within a depression, and the functional fluid can be more surely prevented from flowing over the top face of the second bank into a region where no functional fluid is required. Such a structure, in which the first bank is lyophobic on the upper face where the second bank is not arranged and the second bank is lyophobic on the top face, can be produced by performing, at one time, a lyophobicity providing process on the upper face of the first bank where the second bank is not arranged and on the top face of the second bank. Accordingly, the production process can be simplified.

The second bank is preferably lyophilic to a functional fluid on a side face. With this structure, the functional fluid spreads along the side faces of the second bank more easily, and thus a flatter thin film can be produced.

The functional fluid applied to a partitioned region spreads within the partitioned region along the side faces of the second bank that face each other, and the fluid surface of the functional fluid reaches the ends of the top face of the second bank. At this time, the fluid surface of the applied functional fluid is lower at a position farther from the second bank. If the fluid surfaces of the functional fluid flowing along the opposite side faces of the second bank respectively reach the surface of the substrate without coming into contact with each other, a void portion is generated in which no functional fluid exists on the substrate within the partitioned region, and thereby no thin film will be formed in the void portion. Therefore, in order to surely prevent generation of such a void portion, the second bank may be designed to have an appropriate height that does not generate a void portion.

Now, the condition for not generating a void portion, in which no functional fluid exists on the substrate in a region sandwiched by the second bank parts, will be described with reference to a drawing. FIG. 6 is a cross-sectional view schematically illustrating the state where the functional fluid is applied in the region sandwiched by the second bank parts. Note that the first bank is not illustrated in FIG. 6. As illustrated in FIG. 6, h1 represents a distance from the surface of a substrate 110 to the top face of a second bank 112; α represents a taper angle of the second bank 112 to the substrate 110 (an angle of gradient of a side face of the second bank 112 in a cross section); θ represents an angle of contact of a functional fluid 130 to a side face of the second bank 112; ε represents a crossing point of lines drawn at an angle of θ from the ends of the top face of the second bank 112; y represents a distance from an end of the top face of the second bank 112 to ε in a plan view; d represents a length of the bottom face between the opposite parts of the second bank 112 (the length of the bottom face in the partitioned region); h2 represents a height difference between the top face of the second bank 112 and ε; and x represents a height difference between ε and the substrate 110. With those representations, the second bank 112 may be designed to always have a height that satisfies the relation x>0. The condition for satisfying the relation x>0, can be led by the following formulas (1) to (3).

$$y = \frac{d}{2} + h1 \cdot \cot\alpha \qquad (1)$$

$$h2 = y \cdot \tan(\alpha - \theta) = \left(\frac{d}{2} + h1 \cdot \cot\alpha\right)\tan(\alpha - \theta) \qquad (2)$$

$$x = h1 - h2 = h1 - \left(\frac{d}{2} + h1 \cdot \cot\alpha\right)\tan(\alpha - \theta) > 0 \qquad (3)$$

The condition led by the formulas (1) to (3) is shown by the following formula (4). Therefore, in order to satisfy the relation x>0,, the second bank may be designed to have a height that satisfies the following formula (4). That is, it is preferable that the partitioned region have a linear planar shape, and the application process comprise applying a functional fluid such that the distance h1 from the surface of the substrate to a top face of the second bank satisfy the following formula (4), when the substrate is observed in a cross section in a short-side direction of the partitioned region in a portion that passes through any of the depressions arranged in the partitioned region, wherein d represents a length of the bottom face of the partitioned region, α represents a taper angle of the second bank to the substrate, and θ represents an angle of contact of the functional fluid to a side face of the second bank.

$$h1 > \frac{d}{2} \cdot \frac{\tan(\alpha - \theta)}{1 - \cot(\alpha)\tan(\alpha - \theta)} \qquad (4)$$

In the above formula (4), a relation h1>65, μm is preferably satisfied. Since the suitable value of d is different according to the application of the thin-film formed substrate, the formula (4) may not be satisfied depending on the value of d. For example, in the case that the thin-film formed substrate of the present invention is used for a display, the pixel size is determined according to the required fineness, and thereby the range for d can be specified. When the values of α and θ are constant, a change in the value of d leads to a change in the right side of the formula (4). For this reason, the formula (4) may not be satisfied depending on the value of d. In contrast, the formula (4) can be surely satisfied with the range of d of 50 to 100, μm when the relation h1>65, μm is satisfied. When θ and α are set to be easily achieved values (θ is 45° or larger, α is 70° to 120°) in the case that the second bank is formed from a common material by a common method, the value of the right side of the formula (4) will not exceed 65, μm even if d is changed within the range of 50, to 100, μm. Therefore, the formula (4) can be satisfied in the range of d of 50, to 100, μm when the relation h1>65, μm is satisfied. In the formula (4), the larger the value of θ, the smaller the value of the right side of the formula. Here, the value of d may be 50, μm or less. Still, in terms of securement of the application margin in the case of using the ink jet method or the like, the relation d>50, μm is preferably satisfied.

If the relations 0°<α−θ<90° and α>90° are satisfied, the term cot(α)tan(α−θ) will be a negative value which is very small as compared to the term tan(α−θ). Thereby, the denominator of the right side of the formula (4) will be a positive value of approximately 1. The above h1 therefore can be represented simply by the following formula (5). That is, if the relations 0°<α−θ<90° and α>90° are satisfied in the formula (4), the above h1 preferably satisfies the following formula (5).

$$h1 > \frac{d}{2} \cdot \tan(\alpha - \theta) \quad (5)$$

If the relation α=90° is satisfied, then the term cot(90°) may be regarded as 0, and the relation of the following formula (6) may satisfied.

$$\tan(90° - \theta) = \frac{\sin(90° - \theta)}{\cos(90° - \theta)} = \frac{\cos(\theta)}{\sin(\theta)} = \cot(\theta) \quad (6)$$

Therefore, the above h1 can be simply represented by the following formula (7). That is, when α=90° in the above formula (4), the above h1 preferably satisfies the following formula (7).

$$h1 > \frac{d}{2} \cdot \cot(\theta) \quad (7)$$

Another aspect of the present invention is an organic EL display device comprising the thin-film formed substrate of the present invention or a thin-film formed substrate produced by the production method of the present invention, wherein the organic EL display device has a first electrode and a second electrode which sandwich the thin film, and the thin film is an organic EL layer. With this structure, since a flat organic EL layer can be produced in a depression, an organic EL display device with little display unevenness can be produced. Further, since the coatability of the organic EL layer can be improved, generation of the leakage current resulting from the short circuit of the first and second electrodes can be suppressed.

Yet another aspect of the present invention is also a color filter substrate comprising the thin-film formed substrate of the present invention or a thin-film formed substrate produced by the production method of the present invention, wherein the thin film is a color filter. With this structure, a color filter substrate having a flat color filter can be produced. Further, use of the color filter substrate of the present invention for a liquid crystal display device enables production of a liquid crystal display device with little display unevenness. In this way, the color filter substrate of the present invention can be suitably used especially for a liquid crystal display device.

Effect of the Invention

The thin-film formed substrate, the organic EL display device, the color filter substrate, and the method of producing a thin-film formed substrate of the present invention enable production of a thin-film formed substrate which can easily achieve improvement in thin-film flatness and a yield rate; an organic electroluminescent display device; a color filter substrate; and a method of producing a thin-film formed substrate.

BEST MODES FOR CARRYING OUT THE INVENTION

The present invention is described in more detail based on the following Examples with reference to the drawings. The present invention is not limited to these Examples.

(Example 1)

Figure 1:
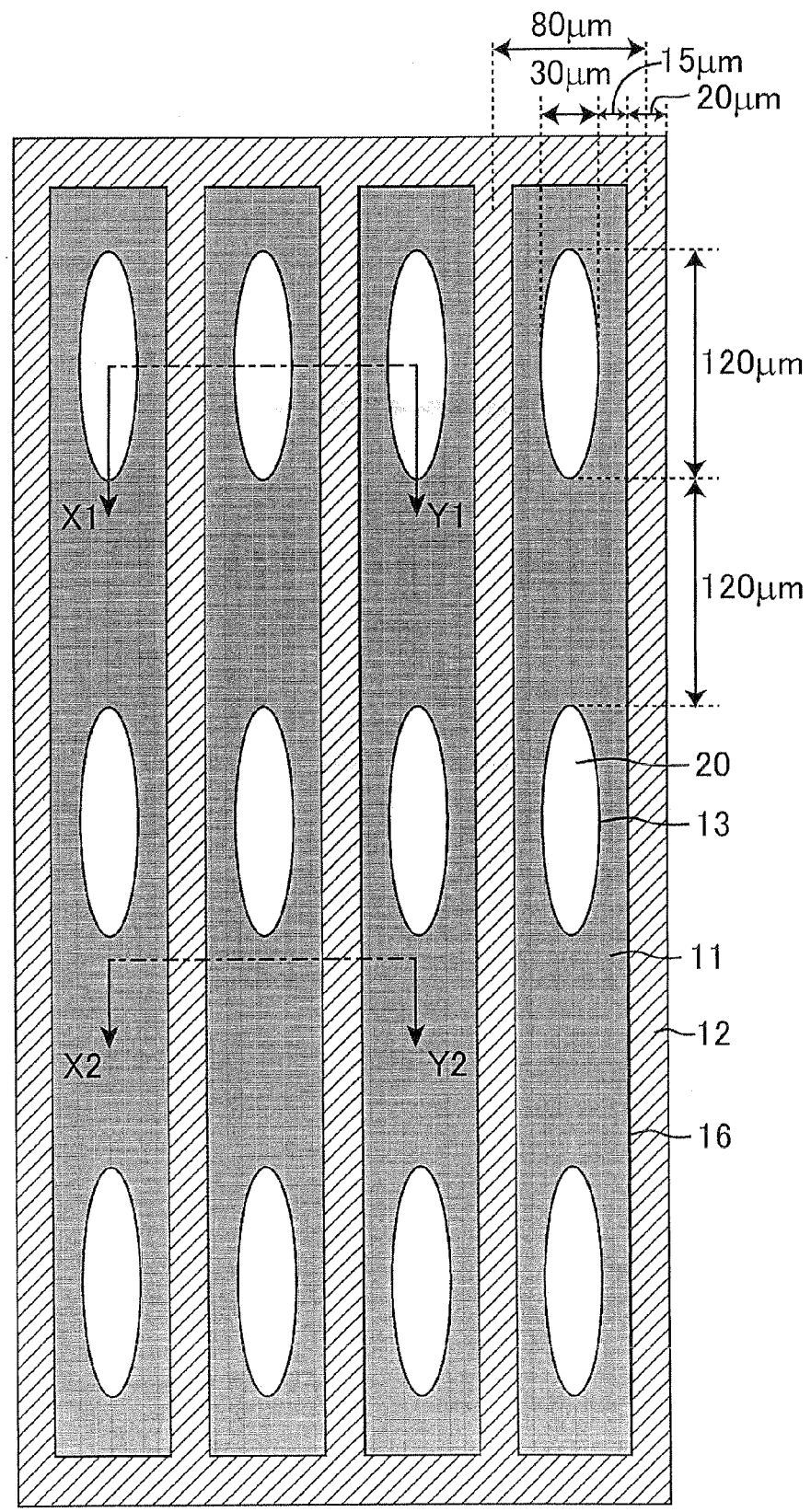
FIG. 1 is a plan view schematically illustrating an organic EL display device of Example 1.
Figure 2:
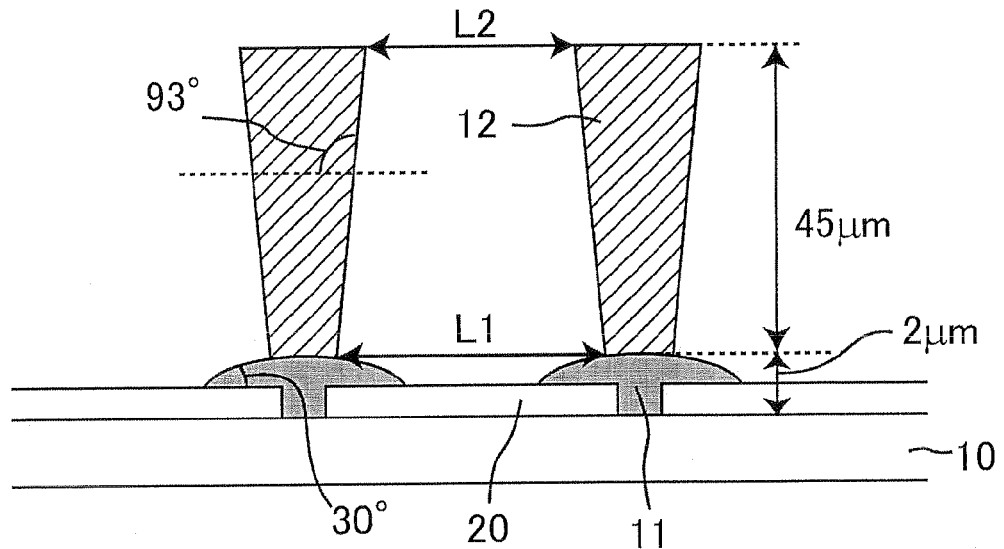
FIG. 2 is a cross-sectional view schematically illustrating the organic EL display device on an X1-Y1 line in FIG. 1 before formation of organic EL layers.
Figure 3:
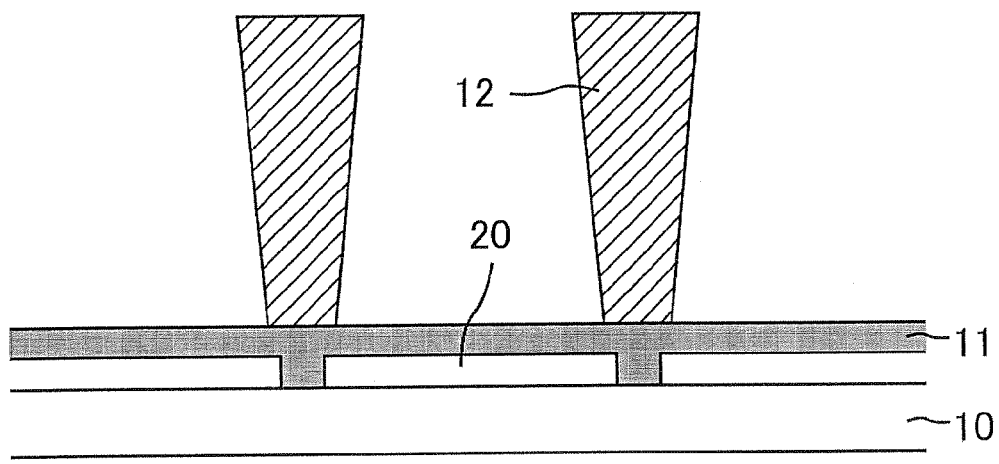
FIG. 3 is a cross-sectional view schematically illustrating the organic EL display device on an X2-Y2 line in FIG. 1 before formation of the organic EL layers.
Figure 7:
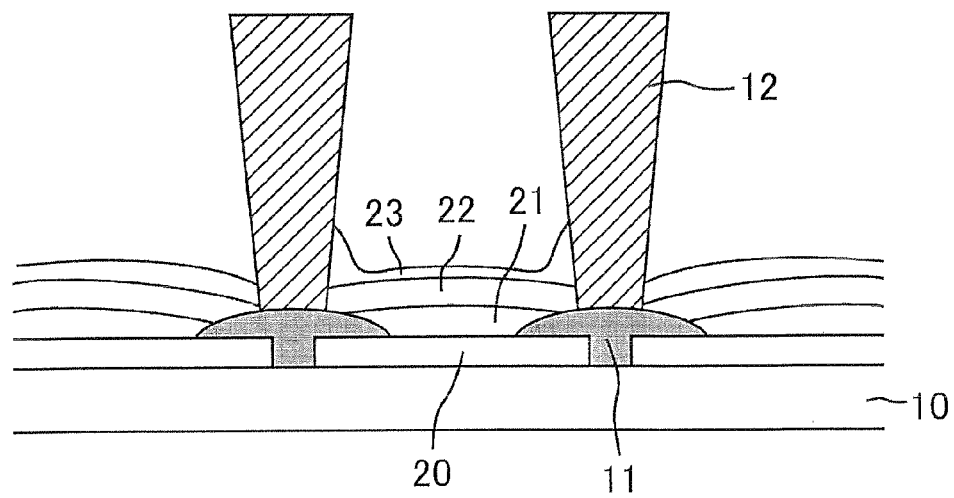
FIG. 7 is a cross-sectional view schematically illustrating the organic EL display device on the X1-Y1 line in FIG. 1 after formation of the organic EL layers and a cathode.
Figure 8:
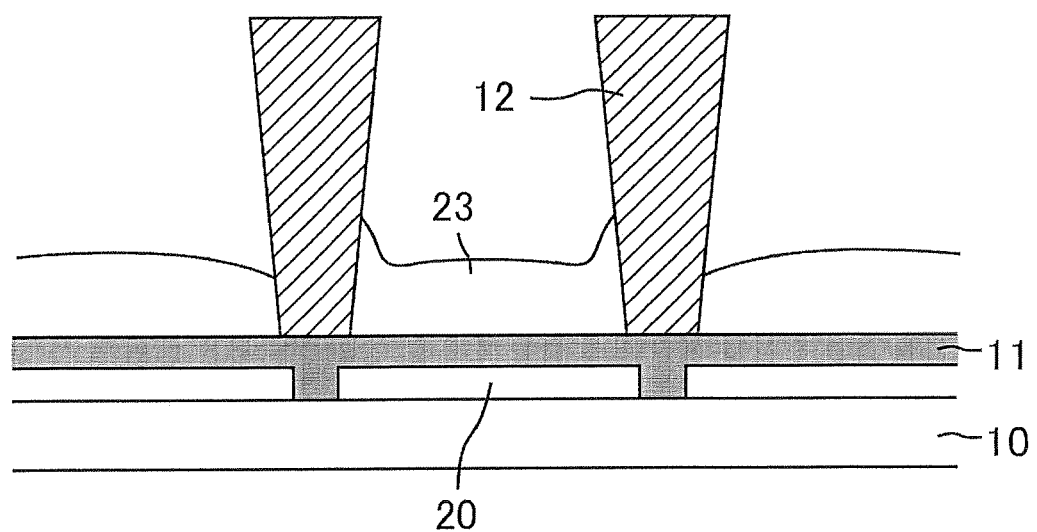
FIG. 8 is a cross-sectional view schematically illustrating the organic EL display device on the X2-Y2 line in FIG. 1 after formation of the organic EL layers and the cathode.
Figure 9:
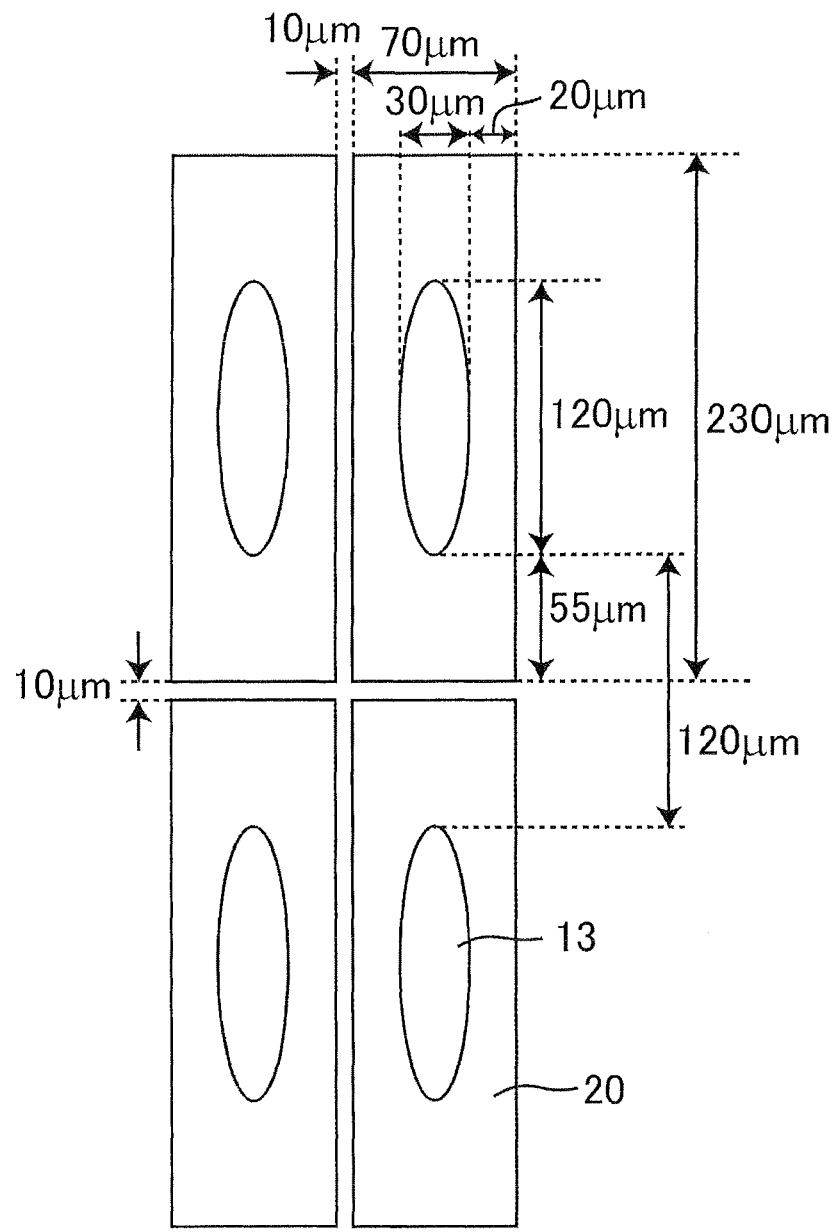
FIG. 9 is a plan view schematically illustrating arrangement of the anodes and depressions in the organic EL display device of Example 1.

FIG. 1 is a plan view schematically illustrating an organic EL display device of Example 1. FIG. 2 is a cross-sectional view schematically illustrating the organic EL display device on an X1-Y1 line in FIG. 1 before formation of organic EL layers. FIG. 3 is a cross-sectional view schematically illustrating the organic EL display device on an X2-Y2 line in FIG. 1 before formation of the organic EL layers. FIG. 7 is a cross-sectional view schematically illustrating the organic EL display device on the X1-Y1 line in FIG. 1 after formation of the organic EL layers and a cathode. FIG. 8 is a cross-sectional view schematically illustrating the organic EL display device on the X2-Y2 line in FIG. 1 after formation of the organic EL layers and the cathode. FIG. 9 is a plan view schematically illustrating arrangement of the anodes and depressions in the organic EL display device of Example 1. As illustrated in FIGS. 1 to 3 and 7 to 9, the organic EL display device of Example 1, is provided with thin-film transistors (TFTs), anodes 20, a first bank 11, and a second bank 12, on a substrate 10. The TFTs are arranged in a matrix form. Each TFT has one anode 20. The first bank 11 is arranged in such a manner as to cover the anodes 20. Each region (depression 13) surrounded by the first bank 11 has a recess formed by the first bank 11 and one of the anodes 20. The first bank 11 forms (defines) multiple depressions 13, and the depressions 13 are arranged for the respective anodes 20. Each depression 13 has an elliptical planar shape. The second bank 12 is arranged on the first bank 11, and the depressions 13 are arranged in the long-side direction of the depressions 13 in each region (partitioned region 16) surrounded by the second bank 12. Each partitioned region 16 has a linear planar shape. The second bank 12 forms (defines) the partitioned regions 16, and the partitioned regions 16 are arranged in stripes (side-by-side). In other words, the second bank 12 has a stripe planar shape with the both ends the stripes closed. On each anode 20, a hole transport layer 21, a light-emitting layer 22, and a cathode 23 are laminated in the stated order from the substrate 10 side. The anodes 20, hole transport layers 21, light-emitting layers 22, and cathodes 23 constitute respective organic EL elements. That is, the organic EL display device of Example 1, has the organic EL elements arranged for the respective depressions 13, and each region (depression 13) having one organic EL element arranged therein functions as one pixel region.

Hereinafter, a method of producing the organic EL display device of Example 1, will be described.

First, the substrate 10 was prepared. A transparent substrate having light transmittance and optical conductivity can be suitably used as the substrate 10, and a glass substrate was used in the present Example. The glass substrate may be one produced from alkali free glass or a glass material such as a silica-based glass material, a multi-component glass material, a rare earth element doped silica-based glass material, and a rare earth element doped multi-component glass material, as well as one produced from commonly used soda glass.

Next, the TFTs were arranged in a matrix form on the substrate 10 by a common method. A semiconductor layer of each TFT may be, for example, an amorphous silicon film or a polycrystalline silicon film. Next, an interlayer insulation film having a function of a flattering layer was formed on the TFTs, and then a 100-nm thick ITO (Indium Tin Oxide) film was formed on the interlayer insulation film by spattering. Thereafter, the ITO film was patterned by photolithography with an aqueous ferric chloride solution as an etching solution, so that the anodes 20 were partitioned to correspond to the respective pixel regions. As illustrated in FIG. 9, each anode 20 has a size of 230, μm (in the long-side direction) and 70, μm (in the short-side direction). Further, the anodes 20 were arranged at intervals of 10, μm. That is, the pixel pitch was 240, μm in the long-side direction and 80, μm in the short-side direction. The interlayer insulation film separates the anodes 20 from the TFTs, and allows, through contact holes made therein, the anodes 20 and the TFTs to be electrically connected. The material of the anodes 20 may be IZO (Indium Zinc Oxide), ZnO, $SnO_2$, $In_2O_3$, or the like, as well as ITO. Each anode 20 preferably has a thickness of 50, to 500, nm, and more preferably 40, to 300 nm. A thickness of each anode 20 of larger than 500, nm may decrease the transmittance and thereby may lead to disadvantages in light emission from the anode 20 side in a bottom-emission organic EL display device, may cause coming off of the anodes 20, or the like. In contrast, a thickness of each anode 20 of smaller than 50, nm may not provide sufficient effects as an electrode.

After that, a photosensitive acrylic resin dispersed in a solvent was applied on the substrate 10 having the anodes 20 formed thereon by the spin coat method such that the thickness of the resin would be about 2, μm, and then the substrate 10 was exposed to light to develop the resin, whereby a first bank 11 having a thickness of about 2, μm was formed on the substrate 10. Examples of the method of forming the first bank 11 include a method of applying a liquid by the spin coat method; a method of attaching a sheet-shaped resin; a method of forming a film by vapor deposition or sputtering in a vacuum; and a method of transferring bank patterns by laser or the like. In the case that the first bank 11 has a thickness of about 2, μm as in the present Example, the first bank 11 is preferably formed by applying a liquid by the spin coat method. This method enables easy formation of the first bank 11 with small taper angles at low cost. The taper angle of the first bank 11 to the substrate 10 was 30°. That is, the first bank 11 has a forward-tapered shape in the present Example. As illustrated in FIGS. 1 and 9, the first bank 11 was formed in such a manner as to leave the anodes 20 exposed by defining on the anodes 20 the elliptical depressions 13 each having a major-axis radius of 60, μm and a minor-axis radius of 15, μm. The distance between one long-side edge of the anode 20 to the outer edge of the depression 13 was 20, μm. The distance between one short-side edge of the anode 20 to the outer edge of the depression 13 was 55, μm. The space between adjacent elliptical depressions 13 in the long-side direction of the depressions 13 was 120, μm. The space between adjacent elliptical depressions 13 in the short-side direction of the depressions 13 was 50, μm. Here, if, for example, the first bank 11 has a taper angle of 90° or larger (if the first bank 11 has a reverse-tapered shape), a functional fluid applied tends to collect on the first bank 11 side. In this case, the fluid surface of the functional fluid at the central part of each anode 20 will be low, which will make it difficult to form a thin film having a uniform desired thickness in each pixel region. Accordingly, the first bank 11 preferably has a forward-tapered shape. The first bank 11 may be produced from any material as long as the first bank 11 can have a desired thickness, and may be produced from a photosensitive polyimide resin or the like as well as the photosensitive acrylic resin. Each depression 13 may have any planar shape as long as the planar shape provides a light emission area as large as possible, and may have a quadrangular shape or a circular shape.

Subsequently, a sheet-shaped photosensitive acrylic resin was attached to the substrate 10 having the first bank 11 formed thereon by a laminating device such that the resin would have a thickness of about 45, μm, and then the resin was exposed to be developed. Thereby, as illustrated in FIG. 2, the second bank 12 having a height of about 45, μm was formed in stripes on the first bank 11. Examples of the method of forming the second banks 12 include the same method as the method of forming the first bank 11. In the case that the second bank 12 has a height of about 45, μm or so which is close to 50, μm as in the present Example, the second bank 12 is preferably formed by attaching a sheet-shaped resin. In this way, the second bank 12 can be formed easily. Here, the second bank 12 was formed such that an end of the bottom face of each depression 13 was 15, μm away from an end of the bottom face of the second bank 12 (an end of the bottom face of the partitioned region 16) in a plan view. The taper angle of the second bank 12 to the substrate 10 was 93°. That is, in the present Example, the second bank 12 has a reverse-tapered shape. Therefore, in a cross-sectional view of the substrate 10 in the short-side direction of the partitioned regions 16, an L1, which is the length of the bottom face of each partitioned region 16 (the interval between the bottom face parts of the second bank 12), is larger than an L2, which is the length of the top face of each partitioned region 16 (the interval between the top face parts of the second bank 12). The second bank 12 may be produced from any material as long as the second bank 12 can have a desired thickness, and may be produced from a photosensitive polyimide resin or the like as well as the photosensitive acrylic resin. The width of the second bank 12 in the short-side direction is not particularly limited, and may be appropriately adjusted according to the shape of the thin-film display device and the properties (such as resolution, thin wire adhesion, and an aspect ratio) of the bank material to be used. In the present Example, as illustrated in FIG. 1, each bottom face part of the second bank 12 has a width in the short-side direction of 20, µm. That is, the second bank 12 in FIG. 1 is illustrated based on the width of the bottom face parts. As illustrated in FIG. 1, the interval of the stripes of the second bank 12 (the length of the bottom face parts of each partitioned region 16 (L1)) was 60, µm, and the pitch of the stripes of the second bank 12 in the short-side direction was 80, µm.

Next, the substrate 10 having the second bank 12 formed thereon was put into a fluorine plasma process using gases such as $CF_4$, $SF_6$, and $CHF_3$, so that lyophobicity would be provided to the upper face of the first bank 11 where the second bank 12 was not formed and the top face of the second bank 12. The above process allows functional fluids (inks) to easily leave the first bank 11 when the functional fluids to be filled in the partitioned regions in the later-described application process are dried. Accordingly, functional fluids can be easily formed into organic EL layers (the hole transport layer 21, the light-emitting layer 22) in each depression 13, without being condensed on the first bank 11. The process can also prevent functional fluids from flowing over the top face of the second bank 12 to flow into adjacent regions via the second bank 12. At this time, the side faces of the second bank 12 go into the shadow of the top face of the second bank 12, and thus are not much affected by the lyophobicity providing process. The side faces of the second bank are therefore not affected by the lyophobicity providing process as long as the lyophobicity providing process is performed under normal conditions. Since the second bank 12 in the present Example does not contain a lyophobic material, the side faces of the second bank 12 are lyophilic. The side faces of the second bank therefore show better wettability to the functional fluids, and thus the functional fluids to be filled in the later-described application process can be wet-spread uniformly on the anodes 20. Also, impurities such as an organic material on the anodes 20 can be removed.

Even in the case of forming the second bank 12 from a lyophobic material, it is possible to provide lyophilicity to the side faces of the second bank 12 by performing a lyophilicity providing process on the substrate 10 having the second bank 12 formed thereon for a long time before performing the above lyophobicity providing process. In this case, although the side faces of the second bank 12 are not much affected by the lyophilicity providing process because they go into the shadow of the top face of the second bank 12, the side faces still gradually become lyophilic because of oblique incidence and diffusion. After that, the lyophobicity providing process may be performed under the normal conditions in order to provide lyophobicity to the upper face of the first bank 11 where the second bank 12 is not formed and the top face of the second bank 12. However, performing the lyophilicity providing process for a long time as described above may possibly cause damage such as film-thickness loss on the first bank 11 and the second bank 12. The second bank 12 is therefore preferably formed without using a lyophobic material.

Next, a functional fluid containing a hole transport material is applied to the regions (partitioned regions 16) partitioned by the second bank 12 (application process). The hole transport material may be a low-molecular or high-molecular material and the material may be a single material or mixed material of two or more kinds, as long as the material can be discharged by a coater and express a hole transport function when being separated from a solvent to form a film after application. Alternatively, a material produced by doping a dopant into a matrix material may be used. In the present Example, PEDOT/PSS (mixture of polyethylene dioxythiophene and polyethylene sulfonic acid) was used as a hole transport material, and water was used as a solvent to have the PEDOT/PSS dispersed or dissolved therein. The angle of contact of a functional fluid produced by mixing the PEDOT/PSS and water to a side face of the second bank 12 is about 60°. When the angle of contact of a functional fluid produced by mixing the PEDOT/PSS and water is set to 90° or smaller, the functional fluid spreads along the side faces of the second bank 12 due to the capillary effect, and the fluid amount within each partitioned region 16 is equalized. As a result, the thicknesses of the hole transport layers 21 to be formed in the pixel regions in each partitioned region 16 in a later-described process can be made uniform. For this reason, the hole transport material and the solvent are preferably selected such that the functional fluid will form an angle of contact of 90° or smaller to the side faces of the second bank 12. As the coater, an ink jet device was used which had an ink jet head with a nozzle in diameter of about 20, µm, a substrate mounting stage, and the like.

Then, the substrate 10 was left to stand for 20, minutes under a condition of 80° C. and 1, Torr ($\approx$133,322, Pa) in a vacuum dryer to dry-remove water, the solvent component in the functional fluid. Thereafter, the substrate 10 was baked for five minutes on a hot plate, so that the hole transport layer 21 was formed. The hole transport layer 21 may have any thickness as long as the characteristics of the hole transport material can be sufficiently provided. The thickness is preferably 5 to 300, nm, and is more preferably 10, to 150, nm. In the present Example, the thickness of the hole transport layer 21 was set to 70, nm. Here, the application method is not particularly limited as long as a functional fluid can be ejected in a desired region and the functional fluid can be accumulated in the region. Other than the ink jet method, the coating method may be a nozzle coat method, a spray method, or the like.

Next, a functional fluid containing a light-emitting material is applied to the regions (partitioned regions 16) partitioned by the second bank 12, in the same manner as in the case of applying a functional fluid containing a hole transport material. The light-emitting material may be a low-molecular or high-molecular material and the material may be a single material or mixed material of two or more kinds, as long as the material can be discharged by a coater and express a hole transport function when being separated from a solvent to form a film after application. Alternatively, a material produced by doping a dopant into a matrix material may be used. In the present Example, a polyfluorene compound represented by the following general formula (1) was used as a light-emitting material, and a non-polar solvent was used as a solvent to have the polyfluorene compound dispersed or dissolved therein. The angle of contact of the functional fluid produced by mixing the polyfluorene compound and the non-polar solvent to a side face of the second bank 12 is about 45°. When the angle of contact of the functional fluid produced by mixing a light-emitting material and a solvent is set to 90° or smaller, the functional fluid spreads along the side faces of the second bank 12 due to the capillary effect, and the fluid amount within each partitioned region 16 is equalized. As a result, the thicknesses of the light-emitting layers 22 to be formed in the pixel regions in each partitioned region 16 in a later-described process can be made uniform. For this reason, the light-emitting material and the solvent are preferably selected such that the functional fluid will form an angle of contact of 90° or smaller to the side faces of the second bank 12.

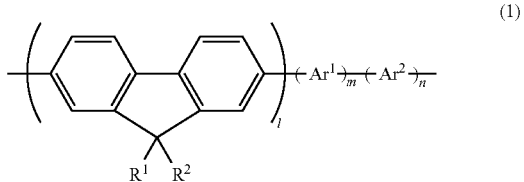

(1)

The polyfluorene compound represented by the general formula (1) is a copolymer compound of a fluorene ring having alkyl chains and at least one unit of an aryl compound. In the general formula (1), each of $R^1$, and $R^2$, represents an alkyl chain; each of $Ar^1$, and $Ar^2$, represents a unit of an aryl compound; each of l, and m is an integer of 1, or greater; and n is an integer of 0, or 1, or greater. Examples of the aryl compound include methylbenzene, pyridine, benzene, anthracene, spirobifluorene, carbazole, benzo amine, bipyridine, and benzothiadiazole. The color of the light to be emitted differs according to the unit to be copolymerized and the ratio of l,, m, and n.

Then, the substrate 10 was dried on a hot plate set to 200° C. for 60, minutes under $N_2$, atmosphere so that the non-polar solvent, the solvent component in the functional fluid, was dry-removed, whereby the light-emitting layers 22 were formed. Each light-emitting layer 22 may have any thickness as long as the characteristics of the light-emitting material can be sufficiently provided. The thickness is preferably 5, to 300 nm, and is more preferably 10, to 150, nm. In the present Example, the thickness of each light-emitting layer 22 was set to 80, nm.

Next, the cathodes 23 were formed on the substrate 10 having the hole transport layers 21 and the light-emitting layers 22 formed thereon, by oblique deposition using a common technique. Metals having a low work function of less than 4.0, eV, such as Ca, Ce, Cs, Rb, Sr, Ba, Mg, and Li, can be used as the material of the cathodes 23. For a high-molecular organic light-emitting layer, metals such as Ca and Ba are suitably used. Such a metal having a low work function is easily degraded by oxygen, water, and the like. For this reason, in the case of being used as the cathodes 23, such a metal is preferably alloyed with a comparatively stable metal such as Ni, Os, Pt, Pd, Al, Au, Rh1, and Ag or laminated with any of those stable metals. In the present Example, a laminated film of a Ca film and an Al film was used as the cathode 23. In a top-emission organic EL display device, each cathode 23 is required to have a small thickness to have light transmittance. In such a case, in order to secure sufficient conductivity as an electrode, a transparent electrode film formed from a conductive metal oxide such as ITO, IZO, ZnO, and $SnO_2$, may be used as the cathode 23. The transparent electrode film may be a single layer film or a laminated film of multiple materials. The thickness of each cathode 23 is preferably 1 to 500, nm, and is more preferably 1, to 200, nm. A thickness of each cathode 23 of larger than 500, nm may decrease the transmittance and thereby may lead to disadvantages in light emission from the cathode 23 side in a top-emission organic EL display device, may cause coming off of the cathodes 23, or the like. In contrast, a thickness of each cathode 23 of smaller than 1, nm may not provide sufficient effects as an electrode. In the present Example, the thickness of each cathode 23 was set to 150, nm.

Lastly, the components formed on the substrate 10 were sealed with a sealing material, and then components that a common organic EL display device has, such as a driving circuit, were mounted on the substrate 10, so that the organic EL display device of the present Example was produced. A transparent or translucent flat-plate material can be used as a sealing material. Common soda glass is used as a sealing material in the present Example. However, the sealing material is not limited to common soda glass, and may be borosilicate glass, aluminosilicate glass, silica glass, quartz, resin, or an inorganic film. It is usually preferable that the adhesive material for adhering a sealing material be transparent or translucent, and do not allow moisture, activated gas, and the like to pass therethrough. Although the adhesive material used in the present Example was a photocurable epoxy resin, the adhesive material to be used is not limited to a photocurable epoxy resin, and may be a thermosetting epoxy resin.

The organic EL display device of the present Example was produced under conditions that the above formula (4) was satisfied. In the formula (4), h1 represents a distance from the substrate 10 to the top face of the second bank 12. In the present Example, the first bank 11 has a thickness of 2, μm and the second bank 12 has a thickness of 45, μm as illustrated in FIG. 2, and thus the relation h1=47, μm is satisfied. Also, d represents the distance between the bottom portions of the second bank 12 which face each other with the depressions 13 therebetween. In the present Example, the distance from an end of each depression 13 to a contact portion between the second bank 12 and the first bank 11 is 15, μm and the length in the short-side direction of each depression 13 is 30, μm in a plan view as illustrated in FIG. 1, and thus the relation d=60, μm is satisfied. The symbol a represents a taper angle of the second bank 12 to the substrate 10, and is 93° in the present Example, as illustrated in FIG. 2. The symbol θ is a contact angle of a side face of the second bank 12 to the functional fluid. In the present Example, the relation θ=60° is satisfied in the case of a functional fluid containing a hole transport material, and thus the formula (4) is satisfied. Alternatively in the case of a functional fluid containing a light-emitting material, the relation θ=60° is satisfied and thus the formula (4) is satisfied.

(Example 2)

The organic EL display device of Example 2, was produced by the same procedure as that for Example 1,, except that the taper angle of the second bank 12 to the substrate 10 was set to 70°. That is, in the present Example, the second bank 12 has a forward-tapered shape.

(Example 3)

The organic EL display device of Example 3, was produced by the same procedure as that for Example 1,, except that the taper angle of the second bank 12 to the substrate 10 was set to 90°. That is, in the present Example, the second bank 12 has a reverse-tapered shape.

(Example 4)

Figure 4:
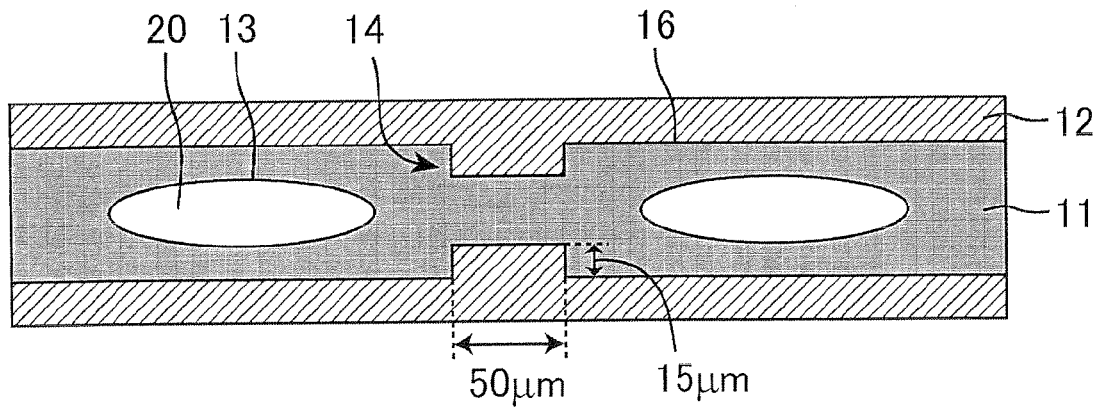
FIG. 4 is a plan view schematically illustrating an organic EL display device of Example 4.

FIG. 4 is a plan view schematically illustrating an organic EL display device of Example 4. The organic EL display device of Example 4, has the same structure as the organic EL display device of Example 1,, except for having, on the first bank 11, first objects 14 that project from the second bank 12 toward between adjacent depressions 13 as illustrated in FIG. 4. In the present Example, the first objects 14 are the portions that the second bank 12 extends in the direction perpendicular to the stripe pattern of the second bank 12. Accordingly, in other words, projections of the second bank 12 correspond to the first objects 14. The width of each first object 14 in the direction along the stripe pattern of the second bank 12 was set to 50 μm. The width of each first object 14 in the direction perpendicular to the stripe pattern of the second bank 12 was set to 15, μm. In the present Example, the first objects 14 and the second bank 12 are formed from the same material, but the first objects 14 and the second bank 12 maybe formed from different materials. In terms of simplification of the production process, the first objects 14 and the second bank 12 are preferably formed from the same material as in the present Example.

(Example 5)

Figure 5:
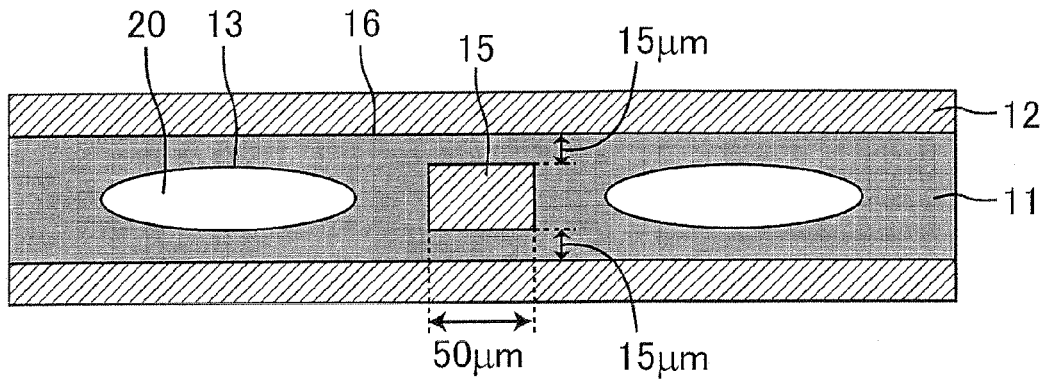
FIG. 5 is a plan view schematically illustrating an organic EL display device of Example 5.
Figure 6:
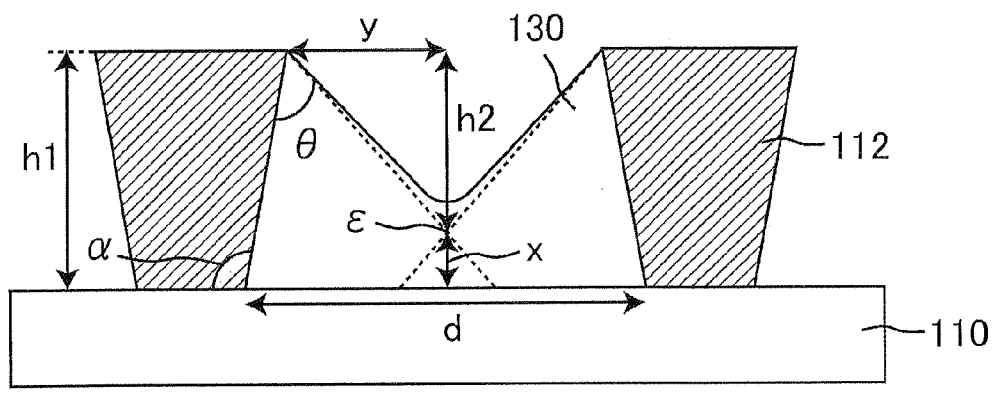
FIG. 6 is a cross-sectional view schematically illustrating the state where a functional fluid is applied in a region sandwiched by second bank parts.

FIG. 5 is a plan view schematically illustrating an organic EL display device of Example 5. As illustrated in FIG. 5, the organic EL display device of Example 5, has the same structure as the organic EL display device of Example 1,, except for having, on the first bank 11, a rectangular second object 15 not in contact with the second bank 12 between adjacent depressions 13. The width of each second object 15 in the long-side direction was 30, μm, and the width of each second object 15 in the short-side direction was 50, μm. The space between the second bank 12 and the second object 15 was 15, μm. In the present Example, the second object 15 and the second bank 12 were simultaneously formed from the same material, but the second object 15 and the second bank 12 maybe formed from different materials. Still, in terms of simplification of the production process, the second object 15 and the second bank 12 are preferably formed from the same material.

(Example 6)

The organic EL display device of Example 6, was produced by the same procedure as that for Example 1,, except that the second bank 12 was formed such that an end of the bottom face of each depression 13 was 10, μm away from an end of the bottom face of the second bank 12 in a plan view.

(Example 7)

The organic EL display device of Example 7, was produced by the same procedure as that for Example 1,, except that an end of the bottom face of each depression 3 was 5, μm away from an end of the bottom face of the second bank 12.

In the process of forming thin films (hole transport layer 21 and light-emitting layer 22) in the process of producing the organic EL display devices of Examples 1, to 7,, the functional fluids spread along the side faces of the second bank 12 in such a manner as to cover the depressions 13 due to the capillary effect and the fluid level of the functional fluid in the respective depressions can be suitably equilibrated. As a result, the functional fluid was collected in an amount required for formation of a thin film having a desired thickness, in each pixel region (depression 13). Even if a functional fluid ejected from the ink jet head was not ejected in a desired direction, the lyophobic top face of the second bank 12 enabled to draw the functional fluid into the region partitioned by the second bank 12 (partitioned region 16), and to prevent the functional fluid from flowing over the top face of the second bank 12 into a region where no functional fluid was required. Further, since the lyophobic first bank 11 more surely pinned the functional fluid in the depressions 13 in the process of drying the solvent in the functional fluid, the functional fluid was enclosed within the depressions 13. This mechanism enabled to produce a flat film for each pixel region. Since the functional fluid to be the light-emitting layer 22 spread along the side faces of the second bank 12 in such a manner as to cover the depressions 13 due to the capillary effect, the light-emitting layer 22 showed improved coverage to the hole transport layer 21. Thereby, contact between the hole transport layer 21 and the cathode 23 was suppressed, and also the leakage current generated in a conventional structure was suppressed. In each partitioned region 16, since the uniformity of the thicknesses of the thin films formed in the respective pixel regions was improved, uniform light emission was achieved. Such uniform light emission led to improvement in the display qualities of the organic EL display device.

Each of the organic EL display devices of Examples 1, to 7, had the second bank 12, which formed the partitioned regions 16 with the depressions 13 arranged therein in the long-side direction of the depressions 13, on the first bank 11. This structure increased the margin of error caused by the coater head (ejection position margin) as compared to a structure in which the pixel regions (light-emitting portions) were partitioned by only the first bank 11 (i.e., a structure in which the second bank 12 was not provided). Accordingly, those organic EL display devices decreased the difference in the film thickness and improved the production yield.

In Examples 1, 4, 5, 6,, and 7,, the taper angle of the second bank 12 to the substrate 10 was 93°. In Example 3,, the taper angle of the second bank 12 to the substrate 10 was 90°. That is, in these Examples, since the second bank 12 has a reverse-tapered shape, an L1, which is the width of the bottom face of each region between the bottom face parts of the second bank 12 (the length of the bottom face of each partitioned region 16), is larger than an L2, which is the width of the top face of each region (the length of the top face of each partitioned region 16), and provides the relation L1≥L2. Consequently, the side faces of the second bank 12 were not affected by the lyophobicity providing process for the second bank 12, and therefore the second bank 12 of each of the above Examples had higher lyophilicity at the side faces than the second bank 12 of Example 2, having a forward-tapered shape. Thereby, the angle of contact between the side faces of the second bank 12 and the functional fluid could be suitably adjusted, and thus the functional fluid was able to spread easily along the side faces of the second bank 12 due to the capillary effect. As a result, the uniformity in the thickness of thin films (hole transport layer 21, light-emitting layer 22) formed in respective pixel regions was further improved.

In Examples 1, to 7,, satisfaction of the relation of the formula (1) enabled the functional fluid to be surely maintained in the central portion of each pixel. Accordingly, dry-removing the solvent from the functional fluid made it possible to form a thin film (hole transport layer 21, light-emitting layer 22) having a desired thickness for each pixel region. Since the light-emitting layer 22 was formed on condition that the formula (1) was satisfied, the light-emitting layer 22 was able to more surely cover the hole transport layer 21. As a result, the hole transport layer 21 and the cathode 23 were prevented from coming into contact with each other, and the leakage current generated in the conventional structure was suppressed.

In order to produce displays for various applications, the pixel sizes need to be changed according to the respective applications. If the formula (4) needs to be satisfied with the pixel size (d) in the range of 50, to 100, μm with an angle of contact (θ) of a side face of the second bank 12 to the functional fluid being 40°, the height (h1) of the second bank 12 is required to satisfy the relation h1>65, μm. In the case that d is set to a constant value of 60, μm as in Example 1,, the difference in the value of θ has to be considered in order to further improve the liquid level balance. For example, even if the value of θ was decreased from 40° to 35°, the relation h1>65, μm has to be also satisfied. This condition does not apply in the case that d or θ is changed to a value outside the above range, or that both d and θ are further changed. Even in those cases, satisfaction of the formula (4) leads to the effect of the present invention.

The formula (4) can be further simplified in the case that the relations $0<\alpha-<90°$ and $\alpha>90°$ are satisfied in the formula (4), and here, the effect of the present invention can be achieved if the above formula (5) is satisfied.

Further, the formula (4) can be further simplified in the case that the relation $\alpha=90°$ is satisfied, and the effect of the present invention can be achieved if the above formula (7) is satisfied.

As above, with the above formulas (5) and (7), design values required to achieve the effect of the present invention can be easily determined.

As seen in Examples 4, and 5,, formation of the first object 14 or the second object 15 prevented excessive flowing of the function fluid due to the capillary effect. Also, since the second bank 12 had an enclosure-type structure which was similar (analogous) to the structure of the first bank 11, the drying speeds of the functional fluid were able to be uniform within each partitioned region 16. In the above way, the film thickness uniformity of the thin films formed in the respective pixel regions was able to be further improved.

As for the cases of Examples 6, and 7,, a part of the functional fluid maintained in the depressions 13 came into contact with the side faces of the second bank 12 in the production process. For this reason, the uniformity of thin films (hole transport layer 21, light-emitting layer 22) formed in the pixel regions was slightly lower than in those of Examples 1, to 5. Those results taught that an end of the bottom face of each depression 13 was preferably 15, μm or more away from an end of the bottom face of the second bank 12 (an end of the bottom face of the partitioned region 16).

The present application claims priority to Patent Application No. 2008-240881, filed in Japan on Sep. 19, 2008under the Paris Convention and provisions of national law in a designated State, the entire contents of which are hereby incorporated by reference.

EXPLANATION OF NUMERALS AND SYMBOLS 10, 110: Substrate
11: First bank
12, 112: Second bank
13: Depression
14: First object
15: Second object
16: Partitioned region
20: Anode
21: Hole transport layer
22: Light-emitting layer
23: Cathode
130: Functional fluid

The invention claimed is:

1. A thin-film formed substrate provided with a substrate and a thin film formed on the substrate, the thin-film formed substrate comprising:
a first bank forming a depression on the substrate,
a second bank formed on the first bank,
wherein a partitioned region surrounded by the second bank has a plurality of the depressions arranged therein,
the thin film is arranged in each of the depressions; and
wherein the partitioned region has a linear planar shape, the thin-film formed substrate has a first object formed on the first bank, and the first object is in contact with the second bank, and has a planar shape projecting from the second bank toward between the depressions arranged in the partitioned region.

2. The thin-film formed substrate according to claim 1, wherein the partitioned region has a linear planar shape.

3. The thin-film formed substrate according to claim 1, wherein the second bank has a reverse-tapered shape.

4. The thin-film formed substrate according to claim 1, wherein the partitioned region has a linear planar shape, and
a length L1 of a bottom face of the partitioned region, in a cross-sectional view of the substrate in a short-side direction of the partitioned region, and a length L2 of a top face of the partitioned region satisfy the relation $L1 \geq L2$.

5. The thin-film formed substrate according to claim 1, wherein the first bank has a forward-tapered shape.

6. The thin-film formed substrate according to claim 1, wherein the first bank has a forward-tapered shape, and
the second bank has a reverse-tapered shape.

7. The thin-film formed substrate according to claim 1, wherein the first bank is provided with fluorine on an upper face where the second bank is not arranged.

8. The thin-film formed substrate according to claim 1, wherein the second bank is provided with fluorine on a top face.

9. The thin-film formed substrate according to claim 1, wherein the first bank is provided with fluorine on an upper face where the second bank is not arranged, and the second bank is provided with fluorine on a top face.

10. The thin-film formed substrate according to claim 1, wherein a distance h1 from the surface of the substrate to a top face of the second bank satisfies the relation $h1>65$ μm.

11. The thin-film formed substrate according to claim 1, wherein an end of a bottom face of each depression is 15 μm or farther away from an end of a bottom face of the partitioned region.

12. A thin-film formed substrate provided with a substrate and a thin film formed on the substrate, the thin-film formed substrate comprising:
a first bank forming a depression on the substrate,
a second bank formed on the first bank,
wherein a partitioned region surrounded by the second bank has a plurality of the depressions arranged therein,
the thin film is arranged in each of the depressions; and
wherein the partitioned region has a linear planar shape,
the thin-film formed substrate has a second object formed on the first bank, and
the second object is arranged between the depressions arranged in the partitioned region, and is not in contact with the second bank.

13. An organic electroluminescent display device comprising the thin-film formed substrate according to claim 1, wherein the organic electroluminescent display device has a first electrode and a second electrode that sandwich the thin film, and
the thin film is an organic electroluminescent layer.

14. A color filter substrate comprising the thin-film formed substrate according to claim 1, wherein the thin film is a color filter.

15. A method of producing the thin-film formed substrate according to claim 1, the method comprising:
a first bank formation process of forming the first bank on the substrate;
a second bank formation process of forming the second bank on the first bank; and
an application process of applying a functional fluid containing a thin film material to the partitioned region.

16. The method of producing the thin-film formed substrate according to claim 15, wherein the first bank is lyophobic to a functional fluid on an upper face where the second bank is not arranged.

17. The method of producing the thin-film formed substrate according to claim 15, wherein the second bank is lyophobic to a functional fluid on a top face.

18. The method of producing the thin-film formed substrate according to claim 15, wherein the first bank is lyophobic to a functional fluid on an upper face where the second bank is not arranged, and the second bank is lyophobic to a functional fluid on a top face.

19. The method of producing the thin-film formed substrate according to claim 15, wherein the second bank is lyophilic to a functional fluid on a side face.

20. The method of producing the thin-film formed substrate according to claim 15, wherein the partitioned region has a linear planar shape, and the application process comprises applying a functional fluid such that the distance h1 from the surface of the substrate to a top face of the second bank satisfy the following formula (1), when the substrate is observed in a cross section in a short-side direction of the partitioned region in a portion that passes through any of the depressions arranged in the partitioned region:

$$h1 > \frac{d}{2} \cdot \frac{\tan(\alpha - \theta)}{1 - \cot(\alpha)\tan(\alpha - \theta)} \quad (1)$$

wherein d represents a length of the bottom face of the partitioned region, α represents a taper angle of the second bank to the substrate, and θ represents an angle of contact of the functional fluid to a side face of the second bank.

21. The method of producing the thin-film formed substrate according to claim 20, wherein a relation h1>65 μm is satisfied in the formula (1).

22. The method of producing the thin-film formed substrate according to claim 20, wherein h1 satisfies the following formula (2) when relations 0°<α−θ<90° and α>90° are satisfied in the above formula (1):

$$h1 > \frac{d}{2} \cdot \tan(\alpha - \theta). \quad (2)$$

23. The method of producing the thin-film formed substrate according to claim 20, wherein h1 satisfies the following formula (3) when a relation α=90° is satisfied in the above formula (1):

$$h1 > \frac{d}{2} \cdot \cot(\theta). \quad (3)$$

24. An organic electroluminescent display device comprising a thin-film formed substrate produced by the method of producing the thin-film formed substrate according to claim 15, wherein the organic electroluminescent display device has a first electrode and a second electrode which sandwich the thin film, and the thin film is an organic electroluminescent layer.

25. A color filter substrate comprising a thin-film formed substrate produced by the method of producing the thin-film formed substrate according to claim 15, wherein the thin film is a color filter.

\* \* \* \* \*